United States Patent [19]

Inoue et al.

[11] Patent Number: 4,716,370

[45] Date of Patent: Dec. 29, 1987

[54] COIL ARRANGEMENT FOR PRODUCING STATIC MAGNETIC FIELD

[75] Inventors: Yuji Inoue; Hideto Iwaoka; Tadashi Sugiyama, all of Tokyo, Japan

[73] Assignees: Yokogawa Electric Corporation; Yokogawa Medical Systems, Limited, both of Tokyo, Japan

[21] Appl. No.: 778,368

[22] Filed: Sep. 20, 1985

[30] Foreign Application Priority Data

Sep. 27, 1984 [JP] Japan .................................. 59-202450

[51] Int. Cl.⁴ .............................................. G01R 33/20
[52] U.S. Cl. .................................... 324/319; 324/318; 335/299
[58] Field of Search ................ 324/318, 319, 320, 300, 324/307, 309, 322; 335/299; 336/183, 224

[56] References Cited

U.S. PATENT DOCUMENTS

| 3,140,432 | 7/1964 | Imanaka ................... 336/224 |
| 4,095,202 | 6/1978 | Danielsson et al. ................ 335/299 |
| 4,385,277 | 5/1983 | Hanley .................................. 324/319 |
| 4,490,675 | 12/1984 | Knuettal et al. ..................... 324/318 |
| 4,584,548 | 4/1986 | Inoue et al. ........................... 335/299 |
| 4,595,899 | 6/1986 | Smith et al. ........................... 335/299 |
| 4,644,281 | 2/1987 | Savelainen ........................... 324/320 |
| 4,654,596 | 3/1987 | Savelainen ........................... 324/320 |
| 4,656,447 | 4/1987 | Keim et al. ..................... 335/299 X |

FOREIGN PATENT DOCUMENTS 0105565 4/1984 European Pat. Off. ............ 324/307

OTHER PUBLICATIONS

M. W. Garrett, Axially Symmetric ... Magnetic Fields, J. of Applied Physics, vol. 22, No. 9, Sep. 1951.
H. L. Marshall et al., Application ... Superconducting Solenoids, J. of Applied Physics, vol. 34, No. 11, Nov. 1963.

Primary Examiner—Michael J. Tokar
Assistant Examiner—Scott M. Oldham
Attorney, Agent, or Firm—Moonray Kojima

[57] ABSTRACT

A coil arrangement for producing a static magnetic field comprising a central coil and two outer coils disposed on opposite sides of the central coil. The positions and dimensions of the coils are so selected that each term contained in the Taylor series of the function of the magnetic field in the axial direction (z axis) of the coil arrangement in minimized. The current density in the central portion of the central coil is made to be higher than at other portions. The inventive coil arrangement is smaller in size, lighter in weight, and consumers a smaller amount of power than the prior art for the same magnetic strength and with a better homogeneous magnetic field.

2 Claims, 7 Drawing Figures

COIL ARRANGEMENT FOR PRODUCING STATIC MAGNETIC FIELD

BACKGROUND OF THE INVENTION

1. Field of Invention

This invention relates to coil arrangements for producing static magnetic fields, such as those used in NMR (nuclear magnetic resonance) tomographs.

2. Description of Prior Art

NMR spectroscopy is a uniquely effective means for enabling a user to observe matter microscopically, especially in the fields of condensed matter physics and chemistry. NMR spectroscopy uses a uniform static magnetic field and a weak RF magnetic field which weakly interact with a sample to be observed. The energy of the RF magnetic field is usually about $10^{-19}$ to $10^{-20}$ erg, which is much less than the energy for X-rays, which ranges from $10^{-8}$ to $10^{-9}$ erg.

Because of this feature, NMR spectroscopy has attracted much attention as a technique for observing living bodies without injuring them in medical applications. For example, application in clinical medicine in the area of NMR CT (NMR computerized tomography is being studied. This study was stimulated by a report that the relaxation time of protons constituting water molecules of malignant tumor is several times longer than the relaxation time for normal tissues (see Science, Vol. 171, p. 1151, 1971, R. Damadian).

An NMR tomograph which produces cross-sectional images of an object under examination, utilizing the NMR phenomenon, usually uses normally conducting magnets of the structure shown in FIG. 2 to produce a static magnetic field, because they are adapted for the human body and have good performance characteristics. In order to obtain images of high quality, the magnetic field homogeneity in the region to be observed is required to be as high as 10 ppm or the like. To achieve this, various designs for the structure of the coil arrangement have been heretofore proposed. One such design is disclosed in "Practical Method of Improving the Uniformity of Magnetic Fields Generated by Single and Double Helmholtz Coils," Rev. Sci. Instrum. 52(3), March 1981, pp 447–453, and is next described with reference to FIG. 2.

Referring to FIG. 2, four coils are arranged symmetrically to cancel out the error terms of the second and fourth orders and even of the sixth order, of the magnetic field. These are known as Helmholtz coils and are frequently used as normally conducting magnets of NMR tomographs. This prior coil system has heretofore been designed using the following criteria.

1. When the coils can be approximated by a concentrated current loop, the intervals between the coils are set as follows:

$$\cos\theta_1 = z_1/R_0 = 0.76506$$

$$\cos\theta_2 = z_2/R_0 = 0.28523$$

The ratio between the ampere turns of the coils is $$AT_2/AT_1 = 1.4660$$

Under these conditions, the error terms of the second, fourth and sixth orders of the magnetic field are all nill. Thus, an eighth order compensation coil arrangement is provided.

2. Double Helmholtz coils having a combination of rectangular cross sections of finite dimensions are designed as follows.

$$\cos\theta_1 = z_1/R_0 = 0.76506$$

$$\cos\theta_2 = z_2/R_0 = 0.28523$$

The ratio between ampere turns of the coils is $$AT_2/AT_1 = 1.46608$$

$$a_1/a_2 = 0.67188$$

If the current densities through the coils are the same, then $$b_1/b_2 = 1.01523$$

The factors are so set that $$a_1, a_2, b_1, b_2 << R_0$$

By selecting the dimensions in this manner, the error terms of the second, and fourth orders of the magnetic field are both zero. Thus, a sixth order compensation coil arrangement is obtained.

3. The dimensions of double Helmholtz coils having rectangular cross sections of finite dimensions, are set as indicated in Table 1 so that an eighth order compensation coil arrangement is obtained. In Table 1, $Na_1$, $Nb_1$, $Na_2$, $Nb_2$ indicate relative number of turns when $a_1$, $b_1$, $a_2$, $b_2$ assume their optimum dimensions.

TABLE 1

|  | Example 1 | Example 2 | Example 3 | Example 4 |
|---|---|---|---|---|
| $b_1/2R_0$ | 0.04206 | 0.09386 | 0.07503 | 0.08116 |
| $z_1/R_0$ | 0.76598 | 0.76847 | 0.76346 | 0.76015 |
| $z_2/R_0$ | 0.28501 | 0.28519 | 0.28638 | 0.28700 |
| $Nb_1$ | 32 | 20 | 15 | 15 |
| $Na_1$ | 16 | 15 | 20 | 24 |
| $Nb_2$ | 25 | 20 | 21 | 23 |
| $Na_2$ | 30 | 22 | 21 | 23 |
| $\gamma_8$ | −2.106 | −2.101 | −2.083 | −2.080 |

When an eighth order compensation coil arrangement is used, the magnetic field has the following relation:

$$B_z(z,0) = B_0[1 + \gamma_8(z/R_0)^8 + \ldots] \quad (1)$$

The conventional coil arrangement for producing a static magnetic field is capable of setting up a magnetic field of a given high homogeneity. However, under any one or more of the above criteria (1), (2), and (3), the inner coils are lengthwise, because $a_2/b_2 \geq 1$. Thus, disadvantageously, the coils of this prior structure (a) have large dimensions (the maximum outer dimension of the coils is 1600 mm), (b) consume a large amount of electric power (of about 60 KW), and (c) are relatively heavy (weighing about 2,000 Kg). Also, as compared with these large values, the diameter C of the clear bore (see FIG. 2), that is limited by the smaller coils, takes a small value of about 700 mm.

Thus, the situation in the art is that conventional coil arrangements are largely unsophisticated with magnetic field requirements being produced by large and heavy coil arrangements that require large amounts of power to operate. Efficiency and reliability as well as cost leave much to be desired.

SUMMARY OF THE INVENTION

Accordingly, an object of the invention is to overcome the aforementioned and other deficiencies and disadvantages of the prior art.

Another object is to provide a static magnetic field producing coil arrangement which is small in size, light in weight, consumes less power, and is economical to manufacture.

The foregoing and other objects are attained by the invention which encompasses a coil arrangement for producing a static magnetic field of a high homogeneity. The coil arrangement consists of a single central coil and two outer coils disposed on opposite sides of the central coil. The structural dimensions and placement of the coils are designed so that all of the terms of the Taylor expansion of the function of the magnetic field in the direction of the z axis at the center of the coil arrangement are minimized. Furthermore, the coil arrangement is designed so that the current density in the center of the central coil is made higher than at other portions thereof.

DETAILED DESCRIPTION OF PREFERRED EMBODIMENTS

Before describing the illustrative embodiment, the principles on which a homogeneous magnetic field is produced with be reviewed.

Figure 3:
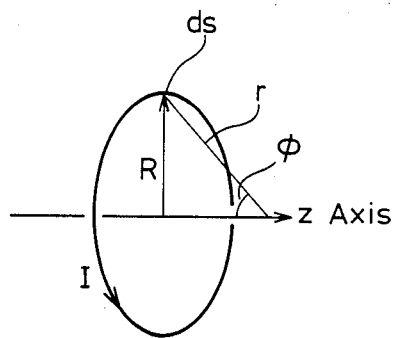
FIGS. 3 and 4 are diagrams illustrating the relation between circulating electric current and magnetic field.

(i) Referring to FIG. 3, an electric current flowing around a coil produces a magnetic field H. According to Biot-Savart's law, the component of the field in the direction of the z axis is given by $$DH(z) = d\theta \sin \phi = \frac{I}{4\pi r^2} \cdot \frac{R}{r} \cdot ds$$

Accordingly, $$H(z) = \int dH = IR^2/2(R^2 + Z^2)^{3/2} \quad (2)$$

wherein R is the radius of the circle or coil, s is the length measured along the circle, H is the magnetic field in the form of a vector, $\phi$ is the angle that ds makes with the z axis at an arbitrary point on the z axis, r is the distance between the arbitrary point on the z axis and ds, and I is the electric current.

Figure 4:
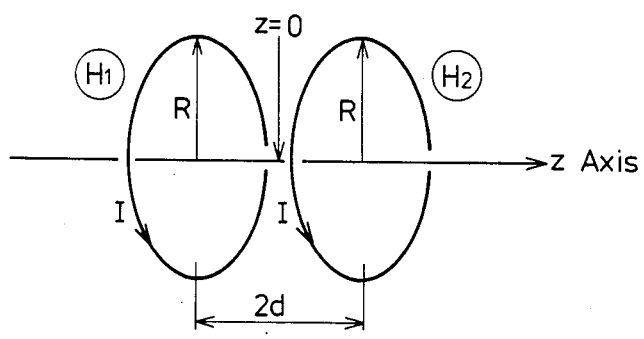

(ii) Referring next to FIG. 4, two electric currents flow around their respective coils which are spaced 2d from each other in a parallel relation. The resulting magnetic field is expressed as follows. The point that lies between the two coils and is equidistant from the coils is defined as $z=0$. The magnetic fields $H_1$ and $H_2$ produced by the coils are given by $$H_1(z) = H(z - d) \quad (3)$$

$$H_2(z) = H(z + d) \quad (4)$$

Using Taylor's theorem and using $H(z)$, equations (3) and (4) are expanded at $z=0$, as given by $$H_1(z) = H_1(0) + \frac{\partial H_1(0)}{\partial z} \cdot z + \frac{1}{2} \frac{\partial^2 H_1(0)}{\partial z^2} \cdot z^2 + \ldots \quad (5)$$

$$= H(d) - \frac{\partial H(d)}{\partial z} + \frac{1}{2} \frac{\partial^2 H(d)}{\partial z^2} \cdot z^2 - \ldots$$

$$H_2(z) = H_2(0) + \frac{\partial H_2(0)}{\partial z} \cdot z + \frac{1}{2} \frac{\partial^2 H_2(0)}{\partial z^2} \cdot z^2 + \ldots \quad (6)$$

$$= H(d) + \frac{\partial H(d)}{\partial z} \cdot z + \frac{1}{2} \frac{\partial^2 H(d)}{\partial z^2} \cdot z^2 + \ldots$$

The combined magnetic field is the sum of $H_1$ and $H_2$ which are respectively produced by the two circulating currents. That is, the addition of equations (5) and (6) produces $$H_1(z) + H_2(z) = 2H(d) + \frac{\partial^2 H}{\partial z^2}(d) \cdot z^2 + \quad (7)$$

$$\frac{2}{4!} \frac{\partial^4 H(d)}{\partial z^4} \cdot z^4 + \ldots + \frac{2}{n!} \frac{\partial^n H(d)}{\partial z^n} \cdot z^n + \ldots$$

wherein n is an even number. It is to be noted that all of the odd terms of z have vanished. When two coils are symetrically arranged with respect to $z=0$, the Taylor series at $z=0$ contain only even order terms of z.

The coefficients of equation (2) are next calculated. Thus the coefficients of the second order equals $$3/R^3(4x^2 - 1)(1 + x^2)^{-7/2} \quad (8)$$

the coefficient of the fourth order equals
$$45/R^5(8x^4 - 12x^2 + 1)(1 + x^2)^{-11/2} \quad (9)$$

and the coefficient of the sixt order equals
$$315/R^7(64x^6 - 240x^4 + 120x^2 - 5)(1 + x^2)^{-15/2} \quad (10)$$

wherein for the sake of simplicity, $z/R$ is replaced by x, and the terms of $1/2$ and $1/n'$ are omitted.

(iii) Thus far described is the far electric current flowing through the lines. The same concept applies to four coils having finite cross sectional areas. The Taylor expansion of the magneqic field produced by the four coils contain only terms of even order of z, in the same manner as in the case of two coils. Since electric currents flowing through lines are considered to be distributed over the cross section, coefficients are found by adding up all the components over the entire cross section, i.e. the performing of an integration.

(iv) In this manner, the magnetic field is expanded at $z=0$ using Taylor's theorem. It is now assumed that the magnetic field $h(z)$ on the z axis produced by the four coils having finite cross sectional areas can be expanded at $z=0$ in such a manner that $$h(z) = a_0 + a_2 z^2 + a_4 z^4 + a_6 z^6 + \quad (11)$$

If $|z|<1$, then the relation $$|z|^n < |z|^m (n>m)$$

holds. Thus, it can be understood that a coefficient of a lower order effects the homogeneity of the magnetic field to a greater extent. The four coils have three degrees of freedom, i.e., diameters of the coils of two kinds and the distance from the center. Thus, the shapes of the four coils are designed to minimize all the three terms $|a_2|$, $|a_4|$, $|a_6|$ or to minimize $(|a_2|^2+|a_4|^2+|a_6|^2)^{1/2}$, for producing a highly homogeneous static magnetic field.

Having discussed the principles on which a homogeneous magnetic field is produced, the standards for judging a magnet for producing a static magnetic field will now be described.

(A) Generally, standards for measuring performance of a magnet are as follows.
(A-1) homogeneity of magnetic field and its region.
(A-2) weight of the coils.
(A-3) amount of electric power consumed.
(A-4) radius of clear bore.

In practice, as standards (A-1) and (A-4) are increased, a better result is obtained. As standards (A-2) and (A-3) are reduced, a better result is attained. However, if standard (A-2) is reduced, standard (A-3) is increased. If standard (A-1) is increased, standards (A-2), (A-3) and (A-4) are increased. If standard (A-4) is increased, standards (A-2) and (A-3) are increased. Thus, it can be appreciated that these standards cannot be simultaneously all be set to an optimum value. Thus, it is not a simple matter to judge the performance of a magnet using the above standards.

However, since the magnet is used to produce a static magnetic field, a high homogeneity is required. Furthermore, the strength of the magnetic field is limited to a certain range. For these reasons, standards (A-2), (A-3) and (A-4) should be compared under conditions wherein the magnet produces the same magnetic field strength over the same area of homogeneous region, e.g. the homogeneity is less than 10 ppm.

(B) Accordingly, the following evaluation functions may be introduced. The product of the weight of the coils and the amount of electric power consumed is constant so long as the shape of the coils is not varied greatly.

The amount of power consumed $= P = I^2(2\pi R/S)\rho \cdot N$ weight $= W = S \cdot 2\pi R \cdot N \cdot \delta$ Therefore, $P \times W = I^2 (2\pi R)^2 \cdot N^2 \cdot \pi \cdot \delta = $ (ampere-turn)$^2 \cdot (2\pi R)^2 \cdot \pi \cdot \delta$ wherein I is current, S is the cross sectional area of each wire, $\pi$ is the resistivity of the wires, N is the number of turns of the wires, $\delta$ is the weight per unit volume of the wires, and R is the radius of a coil. That is to say, if the product of the amount of electric power consumed and the weight of the coils is smaller and if the radius of the clear bore is smaller, then the coils will produce a better static magnetic field. Therefore, we consider as an important evaluation function (amount of power consumed)×(weight of coils)$=P \times W$ Referring next to FIG. 1, the main portions of a static field producing coil arrangement according to an illustrative embodiment of the invention are shown in cross section. This coil arrangement consists of a central coil $l_1$ disposed at the center and two outer coils $l_2$ and $l_3$ disposed on opposite sides of the central coil. The current density in the central portion P of the central coil $l_1$ is made to be higher than at other portions of the central coil. The central portion P has a width w in the direction of the z axis.

The valve of the radius RI of central coil $l_1$ may be varied for certain sizes and shapes of the cross section of the coil. When this was done, the positions of the coils $l_1$, $l_2$, $l_3$, the radii of the outer coils $l_2$ and $l_3$, and the width w of the central portion P of the central coil $l_1$ are so set that the terms of the second, fourth, and sixth orders of the Taylor series of the magnetic field expanded at $x=y=z=0$ are all minimized, using the above formulas.

For example, the central coil $l_1$ can be considered to be in the nature of two coils of the same shape overlapping each other with the overlapped portion being the central portion P of the coil $l_1$, and the current density in this central protion being twice that in other portions. Thus, the positions and the radii of the coils can be found in substantially the same manner as in the case of double Helmholtz coils.

Figure 5:
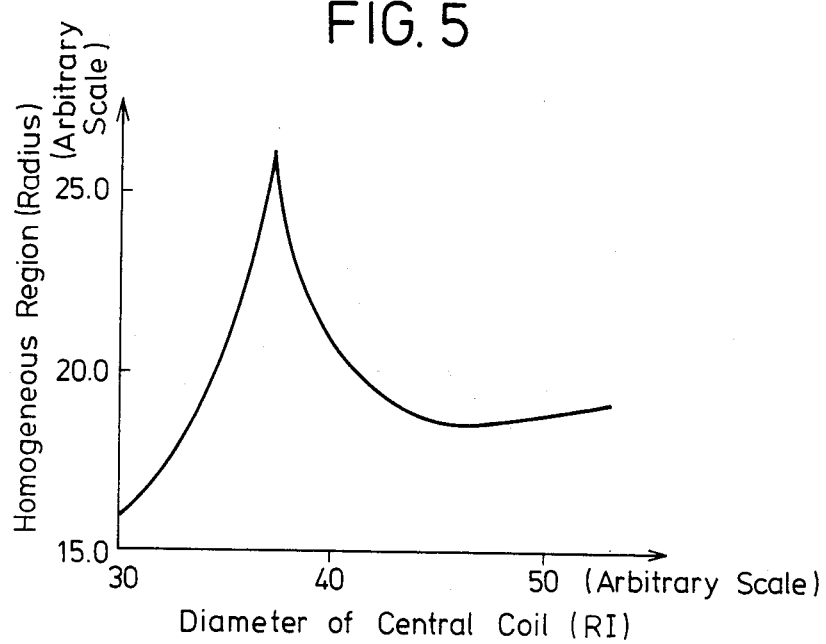
FIG. 5 is a graph depicting the relation between a homogeneous region and radius RI of a central coil.

The manner in which the area of the radial homogeneous region, e.g. less than 10 ppm, is varied by changing the radius RI of the central coil $l_1$ under these conditions is illustrated in the graph of FIG. 5, which was theoretically derived. As can be seen from this graph, when the radius RI of the central coil $l_1$ assumes a certain value, the homogeneous region becomes very broad. That is, only a slight change in the cross sectional area of a coil can greatly widen the homogeneous region.

Figure 7:
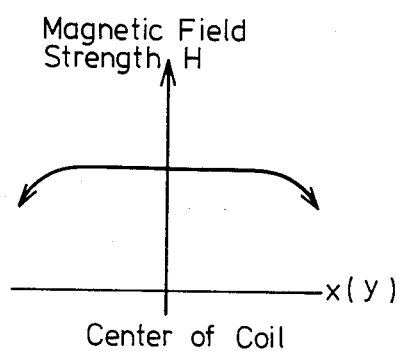
FIG. 7 is a graph depicting distribution of strength of magnetic field produced by Helmholtz coils having larger radii.

This will now be explained qualitatively. When the radius RI of a coil is large, in the central portion of the coil that is not very close to the winding, the distribution of magnetic field is such that the strength H of the magnetic field decreases from the center of the coil towards the radially peripheral portions, as illustrated in FIG. 7.

Figure 6:
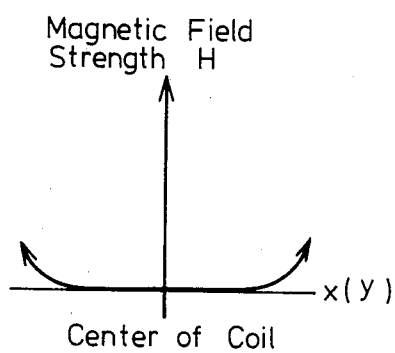
FIG. 6 is a graph depicting the distribution of the strength of the magnetic field produced by Helmholtz coils having small radii.

On the other hand, when the radius RI of the coils is small, the distribution of the magnetic field is such that the strength H of the magnetic field increases from the center of the coil toward the radially peripheral portions, as illustrated in FIG. 6. As can be seen, at the point of inflection of the magnetic field distribution shown in FIG. 5, the distribution becomes "horizontal" broadening the homogeneous region. Mathematically, this is the case where $\gamma_8$ contained in equation (1) approaches substantially zero.

Figure 1:
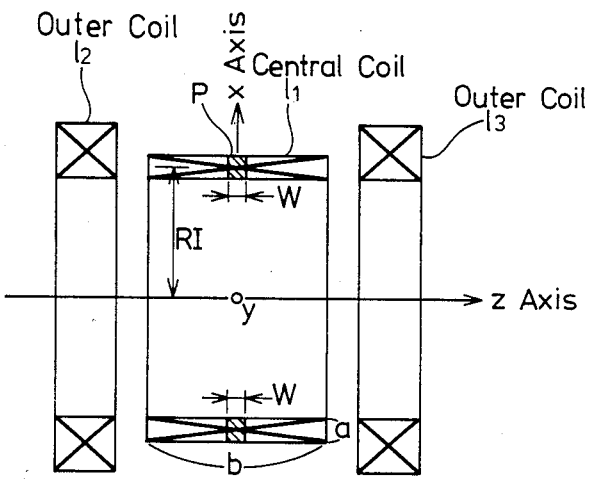
FIG. 1 is a cross-sectional view depicting an illustrative embodiment of the invention.
Figure 2:
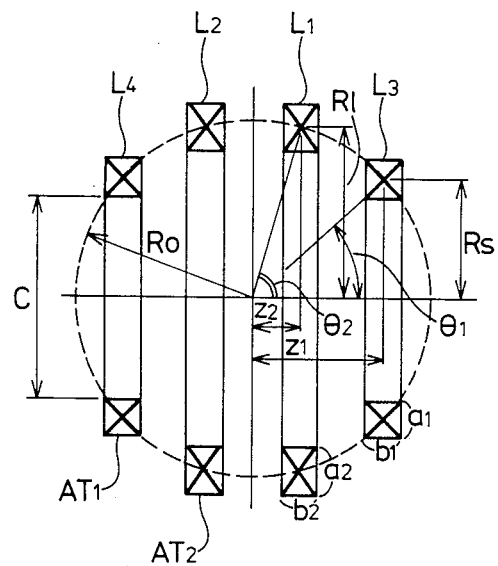
FIG. 2 depicts a conventional coil arrangement for producing static magnetic field.

The coil arrangement is obtained by using the central coil $l_1$ of FIG. 1, wherein the current density in the central portion P of central coil $l_1$ is made to be twice that in other portions. This arrangement can be realized by winding a coil on the central portion P more closely than on other portions, or by causing a greater amount of electric current to flow through this portion P than through the other portions.

Table 2 compares the characteristics of the illustrative embodiment with those of a conventional coil arrangement. The homogeneous region of the magnetic field produced by the invention is broader. Moreover, the invention is smaller in size and lighter in weight and consumes a smaller amount of power.

In the illustrative embodiment, the structural dimensions and placement of the coils were designed so as to minimize the second, fourth and sixth order terms of the Taylor series of the function of the axial magnetic field at the center of the coil arrangement, and the current density at the central portions P was higher than at other portions. In one embodiment, the dimensions and criteria were made to be within the below range. The degree of flatness c/d of the cross section of the coils (The cross sections of the coils are generally rectangular with the larger dimensions being designated "a" for the central coil and "c" for the outer coils, and the shorter dimensions being designated "b" for the central coil and "d" for the outer coils.), the ratio r' of the product of current and number of turns (i.e. ampere-turns) of the central coil $l_1$ to the product of the current and the number of turns (i.e. ampere-turns) of the outer coils $l_2$ and $l_3$, the ratio $R_L/R_S$ of the radius of of the central coil $l_1$ to the outer coils $l_2$ and $l_3$ (the radius being measured from an axis to the center of the cross section of the coil) were as follows:

c/d of central coil $l_1 \simeq 0.08$
a/b of outer coils $l_2$ and $l_3 \simeq 0.5$
$R_L/R_S \simeq 1.3$
$r' \simeq 0.6$

TABLE 2

|  | Conventional coil | Invention coil |
| --- | --- | --- |
| Depth | 1200 mm | 1210.6 mm |
| Width (height) | 1600 mm | 1037.8 mm |
| Weight | 2000 Kg | 1317 Kg |
| Electric power consumed | 60.0 KW | 44.0 KW |
| Homogeneous region, radial | 350 mm | 418 mm |
| along z axis | 100 mm | 299 mm |
| Magnetic field strength | 1500 gauss | 1500 gauss |

As can be appreciated from Table 2, our invention is lighter in weight, smaller in height, has a larger homogeneous region, and consumes less power, than the prior art, for the same magnetic field strength. The factors of weight, size, power consumption and homogeneous region, in the production of the same magnetic field strength, are very important in the quest for greater efficiency, reliability, and cost control. Furthermore, as sheer size and weight are replaced by more efficient structures, such as in our invention, the greater use of the apparatus will take place, thus increasing and broadening a market which will enable a greater portion of the population to enjoy better medical care, for example. The inventors have thus shown that the sledge hammer approach to the problem is not productive; rather, a new approach can being substantial benefits in the improvement of the apparatus.

Advantageously, the normally conducting coil arrangement of the invention acts to produce a static magnetic field and consists of three coils, a central coil and an outer coil on either side of the central coil, which are so designed in terms of the structural dimensions and placement and power requirements, that the degree of flatness of each cross section of the coils, the ratio between electric currents, and ratio between radii of coils satisfy certain values. Consequently, the coil arrangement is smaller, lighter and consumes less power than the prior art.

The foregoing description is illustrative of the principles of the invention. Numerous modifications and extensions thereof would be apparent to the worker skilled in the art. All such modifications and extensions are to be considered to be within the spirit and scope of the invention.

What is claimed is:

1. A coil arrangement for use in an NMR tomograph for producing a static magnetic field, said coil arrangement consisting of a central coil and two outer coils disposed on opposite sides of said central coil, wherein said central coil has a rectangular cross-section comprising a first dimension (a) and a second dimension (b) and a radius $R_L$ measured from an axis to the center of the cross-section, and said two outer coils have a rectangular cross-section comprising a third dimension (c) and a fourth dimension (d), and a radius $R_S$ measured from said axis to the center of the cross section, said first dimension (a) being smaller than the second dimension (b) and said third dimension (c) being smaller than said fourth dimension (d), wherein the ratio (a/b) is about 0.08, the ratio (c/d) is about 0.5, the ratio $R_L/R_S$ is about 1.3, and the ratio of ampere-turns of the central coil to the ampere-turns of the two outer coils is about 0.6.

2. A coil arrangement for use in an NMR tomograph for producing a static magnetic field, said coil arrangement consisting of a central coil and two outer coils disposed on opposite sides of said central coil; wherein said central coil has a rectangular cross section comprising a first dimension (a) in the X-axis direction, a second dimension (b) in the Z-axis direction, and a center portion (P) having a length dimension (W) in the Z-axis direction; wherein said length dimension (W) is substantially smaller than the second dimension (b), and other portions of said central coil equals said second dimension (b) less said length dimension (W); wherein said center portion (P) has a greater number of windings per unit dimension in the X-axis direction and in the Z-axis direction than for the other portions of said central coil; wherein said center portion (P) has a current density of about twice the current density of said other portions of said central coil; and wherein further are provided means for applying current to said center portion (P) of said central coil greater than current applied to said other portions of said central coil.

* * * * *